United States Patent [19]
Sparks

[11] Patent Number: 5,977,824
[45] Date of Patent: Nov. 2, 1999

[54] CIRCUIT FEEDBACK LOOP WITH MONITORED LOOP GAIN

[75] Inventor: Geoffrey S. Sparks, Kings Hedges, United Kingdom

[73] Assignee: U.S. Philips Corporation, New York, N.Y.

[21] Appl. No.: 09/029,530

[22] PCT Filed: Jun. 18, 1997

[86] PCT No.: PCT/IB97/00737

§ 371 Date: Feb. 27, 1998

§ 102(e) Date: Feb. 27, 1998

[87] PCT Pub. No.: WO98/00910

PCT Pub. Date: Jan. 8, 1998

[30] Foreign Application Priority Data

Jun. 28, 1996 [EP] European Pat. Off. .............. 96110468

[51] Int. Cl.$^6$ .............. G01R 19/00; G01R 1/30; H03F 1/36; H04B 17/00

[52] U.S. Cl. .............. 330/2; 330/75; 324/123 C; 455/226.1

[58] Field of Search .................. 330/2, 293, 75, 330/136; 324/123 C; 455/226.1, 226.2, 226.3, 226.4

[56] References Cited

U.S. PATENT DOCUMENTS 5,381,108  1/1995  Whitmarsh et al. .................. 330/2
5,793,817  8/1998  Wilson ................................. 330/107

*Primary Examiner*—Robert Pascal
*Assistant Examiner*—Patricia T. Nguyen
*Attorney, Agent, or Firm*—Dicran Halajian

[57] ABSTRACT

A circuit arrangement includes a feedback loop, with a forward path and a feedback path, and a re-combining stage. A measuring circuit is provided to produce a measuring signal derived from a result signal and a feedback signal by linear combination.

19 Claims, 3 Drawing Sheets

CIRCUIT FEEDBACK LOOP WITH MONITORED LOOP GAIN

BACKGROUND OF THE INVENTION

This invention relates to a circuit arrangement comprising a feedback loop, which arrangement has a forward path for transmitting a result signal, a feedback path for deriving a feedback signal from the output signal of the forward path and a first re-combining stage for re-combining an input signal with the feedback signal to generate the result signal.

Such a circuit arrangement is known from European Patent Application 598 585. More particularly, the feedback loop described therein has the configuration of a Cartesian loop. Such Cartesian loops—but also feedback loops in more general terms—are to be used for a loop gain for the open feedback loop of which the gain value may at most have slight deviations from the set value for which the loop gain is designed. This is necessary for not affecting the stability of the loop and its bandwidth. In the known circuit arrangement, however, a measurement of the loop gain with open or interrupted feedback is not possible.

SUMMARY OF THE INVENTION

It is an object of the invention to provide a circuit arrangement of the type defined in the opening paragraph, in which the loop gain of the open loop can be measured and monitored without the transmission properties of the loop being affected.

According to the invention, this object is achieved with a circuit arrangement of this type by means of a measuring circuit for the production of a measuring signal, which signal is derived from the result signal and the feedback signal by linear combination.

An advantageous embodiment of the invention is characterized in that the measuring circuit comprises a first measuring signal path to which the result signal is applied and by which it is transmitted with a predefinable first transmission factor, a second measuring path to which the feedback signal is applied and by which the signal is transmitted with a predefinable second transmission factor, and also a second re-combining stage for additively combining the output signals of the measuring paths to form the measuring signal.

Preferably, the feedback loop is then arranged as a Cartesian loop.

Advantageously, the circuit arrangement according to the invention is used within an amplifier arrangement of a telecommunication apparatus.

BRIEF DESCRIPTION OF THE DRAWING

The drawing in which like elements are designated by like reference characters shows in.

DESCRIPTION OF THE PREFERRED EMBODIMENTS

Figure 1:
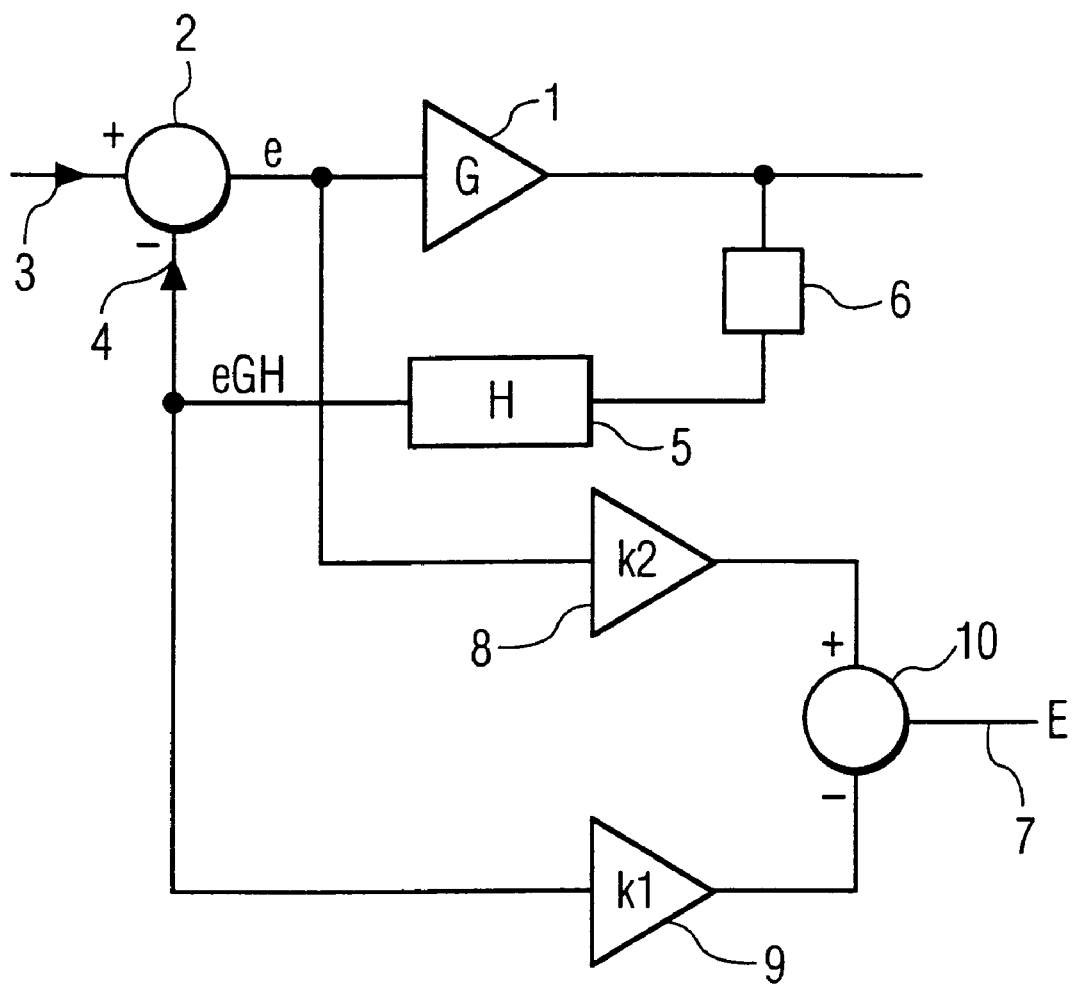
FIG. 1 a block circuit diagram of a circuit arrangement according to the invention, FIG. 2 a detailed embodiment of a measuring circuit for the circuit arrangement shown in FIG. 1.

The circuit arrangement shown in FIG. 1 comprises a forward path 1 shown as an amplifier stage having the gain factor G and whose input is connected to an output of a first re-combining stage 2 for the supply of a result signal. The first re-combining stage 2 is arranged as a subtracter, for example, a differential circuit (differential amplifier). In this first re-combining stage 2, a feedback signal is applied through a second input 4 and is subtracted from an input signal applied through a first input 3, i.e. additively re-combined in accordance with its sign. The feedback signal is generated by a feedback path 5 whose output is connected to the second input 4 of the first re-combining stage 2 and whose input is connected to the output of the forward path 1. An attenuator 6, in principle a part of the feedback path 5, is inserted in FIG. 1 into the link between the output of the forward path 1 and the input of the feedback path 5. For simplicity, however, it will be assumed in the following that the attenuator 6 forms a part of the feedback path 5 and that particularly its attenuation factor is incorporated in the transmission factor, i.e. the gain of the feedback path 5 which is referenced H in FIG. 1. Therefore, if a signal is available as a result signal on the output of the first re-combining stage 2, a signal eGH will appear on the output of the feedback path 5 and thus on the second input 4 of the first re-combining stage 2.

FIG. 1 furthermore includes a measuring circuit for providing a measuring signal at a measuring signal output 7. The measuring circuit shown in FIG. 1 forms the measuring signal by linearly combining the result signal on the output of the first re-combining stage 2 and the feedback signal on the output of the feedback path 5. For this purpose, the measuring circuit shown in FIG. 1 comprises a first measuring signal path 8, which is supplied with the result signal from the output of the first re-combining stage 2, and by which this result signal is transmitted with a predefinable first transmit factor k2. The measuring circuit further includes a second measuring path 9 whose input is connected to the output of the feedback path 5 and by which the feedback signal is transmitted with the predefinable second transmission factor k1. The signals provided on the output of the first measuring signal path 8, or of the second measuring signal path 9 (which signal path 9 may also be referenced second measuring signal path), are additively (in accordance with their sign) re-combined in a second re-combining stage, i.e. subtracted from each other in the present example. The signal forming the difference between the signals from the first measuring signal path and the second measuring signal path is provided as a measuring signal of the measuring circuit on the measuring signal output 7. The second re-combining stage in FIG. 1 is referenced 10.

In this circuit arrangement, the measuring signal on measuring signal output 7 represents a loop gain error signal E. If the same signal level is applied to the first input 3 of the first re-combining stage 2 for measuring purposes, a loop error signal e will be formed as a result signal on the output of the first re-combining stage 2. This loop error signal causes an output signal of magnitude e.G.H to occur on the output of the feedback path 5 or on the second input 4 of the first re-combining stage 2. This output signal forms the origin of a loop gain error signal E of magnitude e.k2-e.G.H.k1. If the transmission factors k1 and k2 are designed so that k2 is equal to the product k1.(G.H)nom, where (G.H)nom is the set value of the loop gain, the value of the loop gain error signal E will become exactly equal to zero if G.H corresponds to (G.H)nom. The value necessary for the loop gain may thus be set by setting the gain factor G or H until the state E=0 is reached.

In general, the aforesaid leads to the fact that the loop gain error signal corresponds to the expression e.k1.(G.H)nom-G.H). Thus, by appropriately selecting the transmission factor k1 or k2, the circuit arrangement may be designed so that there is a desired degree of sensitivity to the loop gain error.

Figure 2:
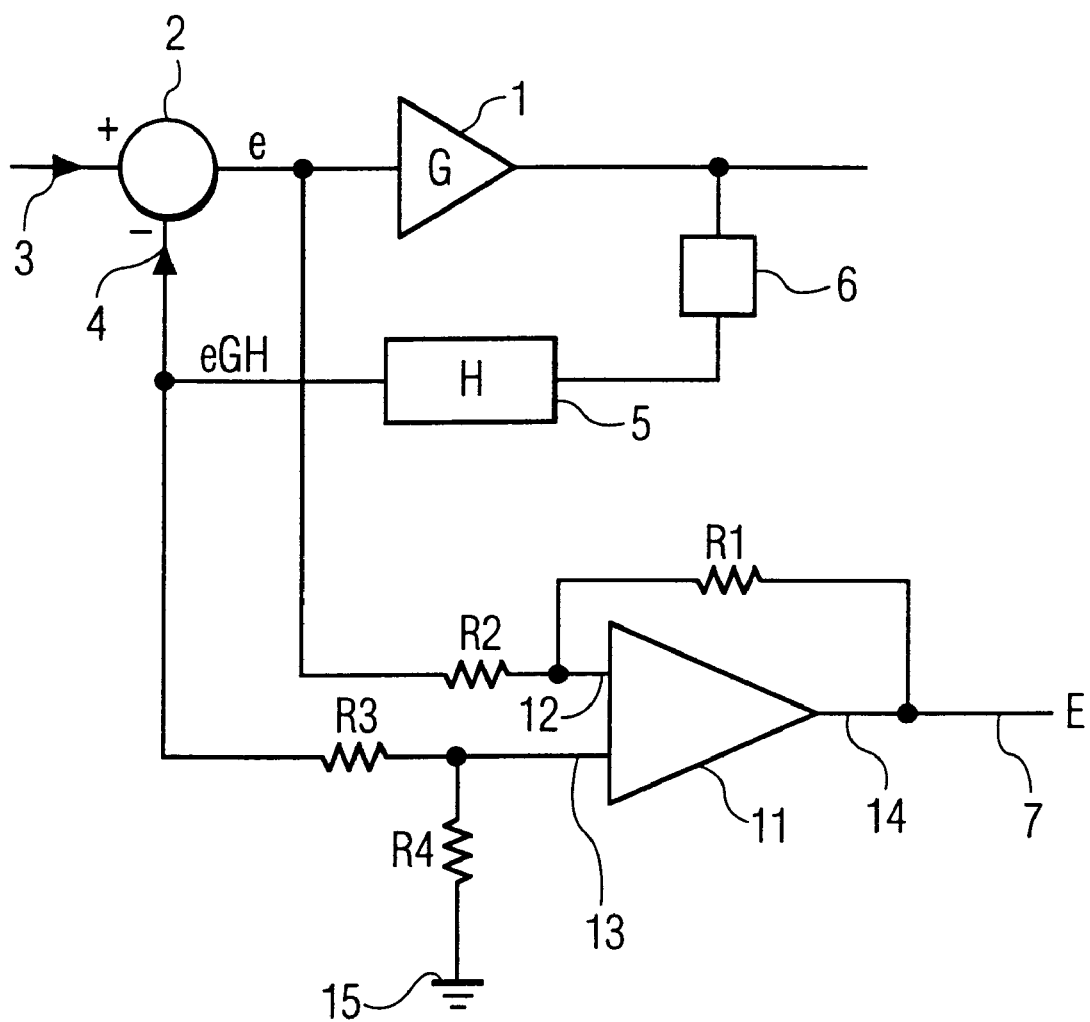

FIG. 2 shows an embodiment of the measuring circuit 8, 9, 10 of FIG. 1. This embodiment comprises an operational amplifier 11 whose first input 12 is connected via a second resistor R2 to the output of the first re-combining stage 2 for the result signal. A first resistor R1 bridges the output 14 of the operational amplifier 11 and the first input 12. The output of the feedback path 5 is connected, via a third resistor R3 to a second input 13 of the operation amplifier 11, which second input is furthermore connected to ground 15 via a fourth resistor R4. The output 14 of the operational amplifier 11 forms the measuring signal output 7.

In this circuit arrangement, the transmission factors k1 and k2 are determined by the following equations:

$$k1=(R1+R2)/R2 \cdot R4/(R3+R4) \text{ and}$$

$$k2=R1/R2.$$

Figure 3:
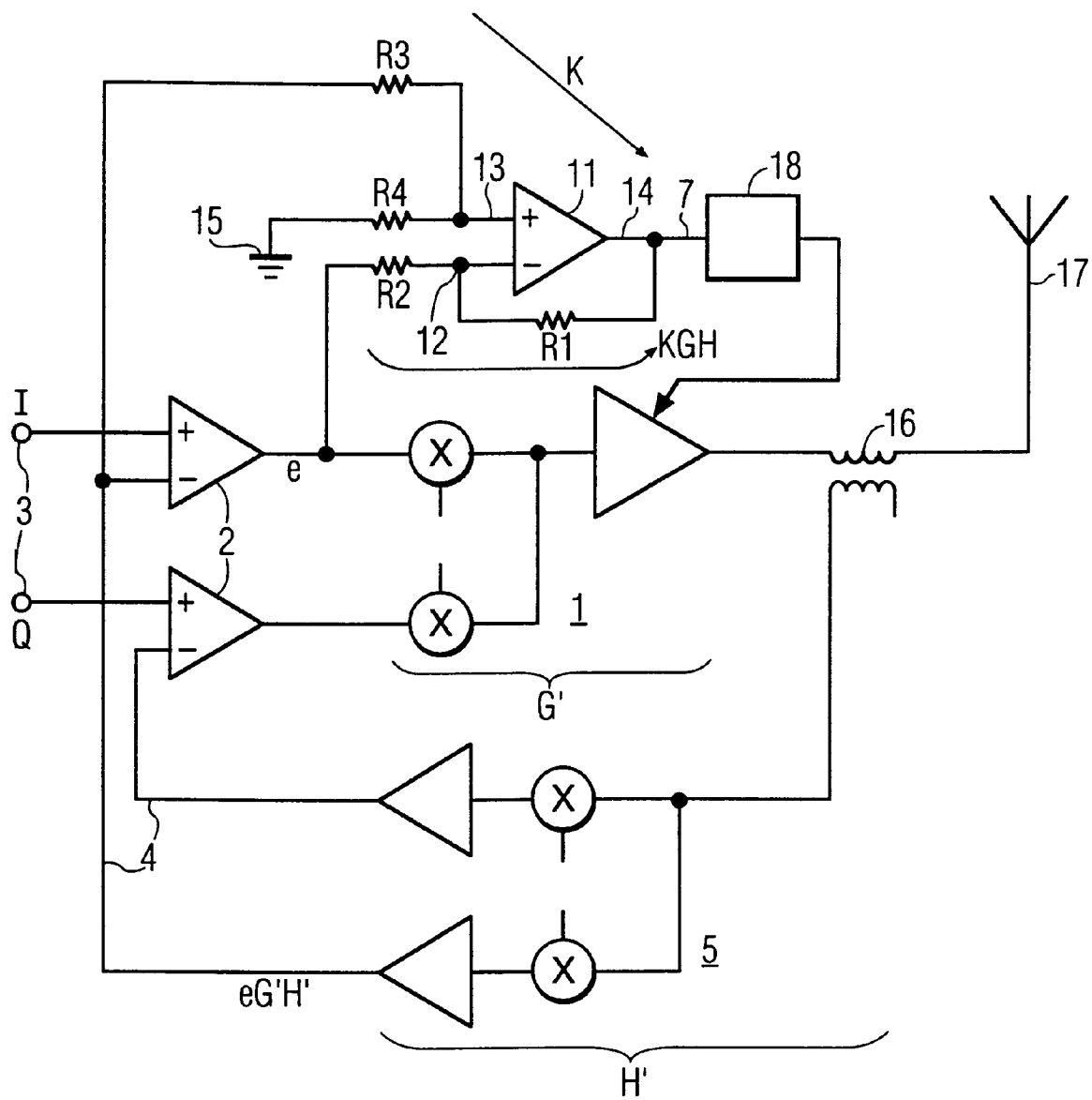
FIG. 3 shows an illustrative embodiment of the invention for a Cartesian loop.

FIG. 3 shows a further modification of the circuit arrangement according to the invention, comprising a Cartesian loop known per se as it is also described in EP 0 598 585 A2 and is therefore represented in FIG. 3 only by way of indication. The output of the forward path 1 is then connected via a directional coupler 16 to an antenna 17 and also to the feedback loop 5. The coupling factor of the directional coupler 16 is then incorporated in the gain H (set value) or H' (actual value) of the feedback path 5. Accordingly, the set value G or actual value G' of the gain factor in the forward path 1 are calculated from the gain of the power amplifier and the transmission factors of the mixers in the Cartesian amplifier. The measuring signal E on measuring signal output 7 then presents itself as the expression K.e.(G'.H'-G.H), while the expression in brackets represents the gain error. The measuring signal E formed in this manner is applied to a controller 18 which then sets the gain factor G' via the gain of the power gain factor in the forward path 1.

The described loop gain control may be used both when a Cartesian loop is formed or when it is adjusted for the first time, and for the running or periodic monitoring of the Cartesian loop. For example, a very large input signal on input 3 may lead to the forward path becoming saturated and thus the signal amplitude being reduced. The measuring circuit according to the invention detects this reduction as a reduction of the loop gain and thus provides the possibility of recognizing distortions caused by overload.

What is claimed is:

1. A power amplifier circuit arrangement comprising:
    a forward circuit path for transmitting a result signal, a feedback circuit path for deriving a feedback signal from an output signal of the forward circuit path, a first combining stage for combining an input signal with the feedback signal to generate the result signal, and a measuring circuit for the production of a measuring signal which is derived by a linear combination of the result signal and the feedback signal, wherein the feedback signal supplied to the first combining stage is independent of the measuring signal.

2. A power amplifier circuit arrangement as claimed in claim 1, characterized in that the measuring circuit comprises a first measuring signal path to which the result signal is applied and by which it is transmitted with a predefinable first transmission factor, a second measuring signal path to which the feedback signal is applied and by which the feedback signal is transmitted with a predefinable second transmission factor, and a second combining stage for additively combining the output signals of the first and second measuring signal paths to form the measuring signal, wherein the feedback signal is supplied to the first combining stage independently of the second combining stage.

3. A circuit arrangement as claimed in claim 2, wherein the feedback loop is a Cartesian loop.

4. A telecommunication apparatus, characterized by an amplifier arrangement as claimed in claim 3.

5. A circuit arrangement comprising, in combination,
    a gain stage having an input and an output,
    a feedback path having an input coupled to the output of the gain stage and having an output,
    a first additive signal combining means having one input continuously coupled to the output of the feedback path, another input for receiving an input signal and an output for a result signal coupled to the input of the gain stage,
    a second additive signal combining means having first and second measuring signal inputs and an output for a loop gain error signal,
    a first measuring signal path having first means for providing a predefinable first transmission factor for continuously supplying a signal which is a function of the result signal to the first measuring signal input of the second additive signal combining means, and
    a second measuring signal path having second means for providing a predefinable second transmission factor for continuously supplying a signal which is a function of the output of the feedback path to the second measuring signal input of the second additive signal combining means.

6. A circuit arrangement as claimed in claim 5, wherein
    the feedback path comprises means for determining a feedback transmission factor,
    the first means for providing a predefinable first transmission factor forms a product of the result signal and said predefinable first transmission factor, and
    the second means for providing a predefinable second transmission factor forms a product of the output of the feedback path and said predefinable second transmission factor.

7. A circuit arrangement as claimed in claim 5, wherein a gain factor selected from one of a gain factor of the gain stage and a gain factor of the feedback path is settable such that the loop gain error signal equals zero.

8. A circuit arrangement as claimed in claim 5, wherein the second additive combining stage comprises an operational amplifier having first and second inputs and an output, the means providing the predefinable first transmission factor comprises a first resistive means coupled between the output and the first input of the operational amplifier and a second resistive means coupled to the first input, and the means providing the predefinable second transmission factor comprises a third resistive means coupled to the second input of the operational amplifier and a fourth resistive means coupled between the second input and a voltage reference point.

9. A circuit arrangement as claimed in claim 8, wherein the predefinable first and second transmission factors k1 and k2, respectively, are determined by the equations:

$$k1=(R1+R2)/R2 \cdot R4/(R3+R4), \text{ and}$$

$$k2=R1/R2$$

where R1, R2, R3 and R4 are the resistance values of the first, second, third and fourth resistive means, respectively.

10. An amplifier arrangement comprising:
    a gain stage having a signal input, a signal output, and a gain control input, a gain controller having an input for a loop gain error signal and an output coupled to the gain control input of the gain stage, and a circuit arrangement for providing the loop gain error signal, the circuit arrangement comprising:

a feedback path having an input coupled to the output of the gain stage and an output, a first additive signal combining means having one input continuously coupled to the output of the feedback path, another input for receiving an input signal and an output for a result signal coupled to the input of the gain stage, a second additive signal combining means having first and second measuring signal inputs and an output for a loop gain error signal, a first measuring signal path having first means for providing a predefinable first transmission factor for continuously supplying a signal which is a function of the result signal to the first measuring signal input, and a second measuring signal path having second means for providing a predefinable second transmission factor for continuously supplying a signal which is a function of the output of the feedback path to the second measuring signal input.

11. An amplifier arrangement as claimed in claim 10, wherein the feedback path comprises means for determining a feedback transmission factor, the first means for providing a predefinable first transmission factor forms a product of the result signal and said predefinable first transmission factor, and the second means for providing a predefinable second transmission factor forms a product of the output of the feedback path and said predefinable second transmission factor.

12. An amplifier arrangement as claimed in claim 10, wherein a gain factor selected from a gain factor of the gain stage and a gain factor of the feedback path is settable such that the loop gain error signal equals zero.

13. An amplifier arrangement as claimed in claim 10, wherein the second additive combining stage comprises an operational amplifier having first and second inputs and an output, the means providing the predefinable first transmission factor comprises a first resistive means coupled between the output and the first input of the operational amplifier and a second resistive means coupled to the first input, and the means providing the predefinable second transmission factor comprises a third resistive means coupled to the second input of the operational amplifier and a fourth resistive means coupled between the second input and a voltage reference point.

14. A circuit arrangement as claimed in claim 13, wherein the predefinable first and second transmission factors k1 and k2, respectively, are determined by the equations:

$$k1=(R1+R2)/R2 \cdot R4/(R3+R4), \text{ and}$$

$$k2=R1/R2$$

where R1, R2, R3 and R4 are the resistance values of the first, second, third and fourth resistive means, respectively.

15. The power amplifier circuit arrangement as claimed in claim 1 wherein the measuring circuit includes a second combining stage responsive to the result signal and the feedback signal and wherein the feedback signal supplied from an output of the forward circuit path to an input of the first combining stage is via the feedback circuit path, said feedback circuit path being exclusive of the second combining stage.

16. The power amplifier circuit arrangement as claimed in claim 1 wherein the measuring circuit is continuously coupled to both the forward circuit path and to an output of the feedback circuit path.

17. The power amplifier circuit arrangement as claimed in claim 1 wherein the forward circuit path includes a first gain control element, the feedback circuit path includes a second gain control element, the measuring circuit comprises first and second measuring signal paths which continuously receive the result signal and the feedback signal, respectively, and means coupled to said first and second measuring signal paths for linearly combining the result signal and the feedback signal so as to produce said measuring signal, and means for coupling said measuring signal to a gain control input of said first gain control element.

18. The power amplifier circuit arrangement as claimed in claim 1 wherein the measuring circuit includes a second combining stage linearly responsive to the result signal and the feedback signal so as to produce said measuring signal, and said feedback circuit path is independent of the measuring circuit.

19. The power amplifier circuit arrangement as claimed in claim 1 wherein the forward circuit path includes a gain control element, and means for coupling said measuring signal to a gain control input of said gain control element.

* * * * *